US009478976B2

(12) United States Patent
Park et al.

(10) Patent No.: US 9,478,976 B2
(45) Date of Patent: Oct. 25, 2016

(54) CIRCUIT PROTECTION DEVICE

(71) Applicant: INNOCHIPS TECHNOLOGY CO., LTD., Ansan-Si, Gyeonggi-Do (KR)

(72) Inventors: In Kil Park, Seongnam-Si (KR); Tae Hyung Noh, Siheung-Si (KR); Gyeong-Tae Kim, Ansan-Si (KR); Myung Ho Lee, Seoul (KR); Jung Hun Lee, Ansan-Si (KR); Euy Ho Shin, Pyeongtaek-Si (KR); Jin Hwan Kim, Gyeongsangnam-Do (KR); Song Yeon Lee, Ansan-Si (KR)

(73) Assignee: INNOCHIPS TECHNOLOGY CO., LTD. (KR)

( * ) Notice: Subject to any disclaimer, the term of this patent is extended or adjusted under 35 U.S.C. 154(b) by 80 days.

(21) Appl. No.: 14/281,845

(22) Filed: May 19, 2014

(65) Prior Publication Data

US 2014/0347773 A1    Nov. 27, 2014

(30) Foreign Application Priority Data

May 24, 2013    (KR) .................. 10-2013-0058780

(51) Int. Cl.
*H02H 9/04*    (2006.01)
*H03H 7/01*    (2006.01)
*H02H 9/00*    (2006.01)
*H03H 1/00*    (2006.01)

(52) U.S. Cl.
CPC ............ *H02H 9/005* (2013.01); *H03H 7/0115* (2013.01); *H03H 2001/0085* (2013.01)

(58) Field of Classification Search
CPC ...... H02H 9/005; H02H 9/04; H03H 7/0115; H03H 2001/0085

USPC .......................................................... 361/56
See application file for complete search history.

(56) References Cited

U.S. PATENT DOCUMENTS

| 5,337,028 A * | 8/1994 | White | H03H 7/0123 333/181 |
| 5,404,118 A * | 4/1995 | Okamura | H01P 1/20345 333/175 |
| 2010/0046130 A1 * | 2/2010 | Park | H01F 17/0033 361/56 |

FOREIGN PATENT DOCUMENTS

| CN | 1212503 A | 3/1999 |
| JP | 3215917 | 9/1991 |
| JP | 6275436 | 9/1994 |
| JP | 2959787 | 7/1999 |
| JP | 200472006 | 3/2004 |
| JP | 2004194170 | 7/2004 |
| JP | 2004266784 A | 9/2004 |
| JP | 2006114801 | 4/2006 |
| JP | 2010524384 A | 7/2010 |
| JP | 4985517 | 5/2012 |
| JP | 2012248917 | 12/2012 |
| JP | 2014230278 A | 12/2014 |
| KR | 20060103273 | 9/2006 |
| KR | 100845947 | 7/2008 |
| KR | 100845948 B1 | 7/2008 |

\* cited by examiner

*Primary Examiner* — Thienvu Tran
*Assistant Examiner* — Kevin J Comber

(57) ABSTRACT

Provided is a circuit protection device including a plurality of sheets selectively formed with at least one coil pattern, at least one withdrawal electrode, at least one hole filled with a conductive material, and at least one capacitor electrode and at least two inductors and at least two capacitors, in which the at least one coil pattern forms one inductor and a capacitor is formed between the capacitor electrode and the coil pattern.

16 Claims, 5 Drawing Sheets

CIRCUIT PROTECTION DEVICE

CROSS-REFERENCE TO RELATED APPLICATION

This application claims priority to Korean Patent Application No. 10-2013-0058780 filed on May 24, 2013 and all the benefits accruing therefrom under 35 U.S.C. §119, the contents of which are incorporated by reference in their entirety.

BACKGROUND

The present disclosure relates to a circuit protection device, and more particularly, to a circuit protection device capable of restraining noises in plural frequency bandwidths.

Recently, various frequency bandwidths are used according to multifunctional mobile electronic devices such as smartphones. That is, in one smartphone, there are used a plurality of functions using different frequency bandwidths such as wireless local area network (LAN), Bluetooth, and GPS. Also, according to high-density integration of electronic devices, the density of internal circuits in a limited space increases, thereby inevitably generating noise interference between internal circuits. For example, a noise of 750 MHz deteriorates communication quality of smartphones and a noise of 1.5 GHz deteriorates quality of global positioning system (GPS).

To restrain noises of mobile electronic devices, having various frequencies, as described above and to restrain noises between internal circuits, a plurality of circuit protection devices are used. For example, there are used condensers, chip beads, and common mode filters removing noises in different frequency bandwidths, respectively. Herein, a common mode filter has a structure, in which two choke coils are combined into one and may remove only a noise current in a common mode while allowing a signal current in a differential mode to pass through. That is, the common mode filter may distinguish a signal current in a differential mode, which is an alternating current, from a noise current in a common mode and may remove the noise current.

Also, it is better to restrain both the noise of 750 MHz deteriorating communication quality of smartphones and the noise of 1.5 GHz deteriorating quality of GPS. However, a general common mode noise filter removes only one of the noises and may not remove both of them. Accordingly, quality of another function may be deteriorated by noises.

SUMMARY

The present disclosure provides a circuit protection device capable of restraining noises in two or more frequency bandwidths.

The present disclosure provides a circuit protection device capable of restraining noises in two or more frequency bandwidths and simultaneously with protecting electrostatic discharge (ESD).

In accordance with an exemplary embodiment, a circuit protection device including a plurality of sheets selectively formed with at least one coil pattern, at least one withdrawal electrode, at least one hole filled with a conductive material, and at least one capacitor electrode and at least two inductors and at least two capacitors, in which the at least one coil pattern forms one inductor and a capacitor is formed between the capacitor electrode and the coil pattern.

A top and a bottom of a first sheet formed with the capacitor electrode may be provided with second and third sheets formed with first and second coil patterns, respectively, and the first and second coil patterns may form inductors, respectively, and capacitors may be formed between the capacitor electrode and the first and second coil patterns, respectively.

The circuit protection device may include a fourth sheet provided on a top of the second sheet and formed with a third coil pattern and a fifth sheet provided on a bottom of the third sheet and formed with a fourth coil pattern. Herein, the first coil pattern may be connected to the fourth coil pattern through the holes filled with the conductive material and formed on the sheets therebetween, and the second coil pattern may be connected to the third coil pattern through the holes filled with the conductive material and formed on the sheets therebetween.

A ratio of an area of the capacitor electrode to an area of the first sheet not formed with the capacitor electrode may be from about 1:100 to about 100:1.

The capacitor electrode may have a shape of one of a quadrangle, a polygon including a shape with rounded corners, a circle, an oval, a spiral, and a meander shape.

Inductance and capacitance may be controlled according to at least one of a number of turns of the coil pattern, an area of the capacitor electrode, and a distance between the capacitor electrode and the coil pattern.

The sheets may be formed with a hole filled with a magnetic material separate from the hole filled with the conductive material.

The circuit protection device may further include first withdrawal electrodes connected to the coil patterns, respectively, and exposed outwards from the sheets, respectively and second withdrawal electrodes connected to the capacitor electrode and exposed outwards from the sheet.

The first withdrawal electrodes may be exposed from two sides of the sheets opposite to one another and the second withdrawal electrode may be exposed from at least one side intersecting with the sides exposed with the first withdrawal electrodes.

The circuit protection device may further include a first external electrode formed on sides of the sheets while being connected to the first withdrawal electrodes and a second external electrode formed on sides of the sheets while being connected to the second withdrawal electrode. Herein, the first external electrode may be connected between an input/output terminal and a circuit and the second external electrode is connected to a ground terminal In accordance with another exemplary embodiment, a circuit protection device includes a first sheet formed with a capacitor electrode, a second sheet formed on a top of the first sheet and formed with a first coil pattern, and a third sheet provided on a bottom of the first sheet and formed with a second coil pattern. Herein, the first and second coil patterns form inductors, respectively, and capacitors are formed between the capacitor electrode and the first and second coil patterns, respectively.

The circuit protection device may include a fourth sheet provided on a top of the second sheet and formed with a third coil pattern and a fifth sheet provided on a bottom of the third sheet and formed with a fourth coil pattern. Herein, the first coil pattern may be connected to the fourth coil pattern through the holes filled with the conductive material and formed on the sheets therebetween, and the second coil pattern may be connected to the third coil pattern through the holes filled with the conductive material and formed on the sheets therebetween.

Inductance and capacitance may be controlled according to at least one of a number of turns of the coil pattern, an area of the capacitor electrode, and a distance between the capacitor electrode and the coil pattern.

In accordance with still another exemplary embodiment, a circuit protection device includes a common mode noise filter laminated with a plurality of sheets selectively formed with at least one coil pattern and at least one capacitor electrode and an electrostatic discharge (ESD) protection device comprising a plurality of sheets selectively formed with at least one withdrawal electrode and at least one hole filled with an ESD protection material. Herein, the common mode noise filter comprises at least two inductors and at least two capacitors, in which the at least one coil pattern forms one inductor and the capacitor is formed between the capacitor electrode and the coil pattern.

The common mode noise filter and the ESD protection device may be laminated top and bottom and coupled with each other.

The common mode noise filter may be provided with a first sheet formed with the capacitor electrode and second and third sheets provided on a top and a bottom of the first sheet and formed with first and second coil patterns, respectively, and the first and second coil patterns may form inductors, respectively, and capacitors may be formed between the capacitor electrode and the first and second coil patterns, respectively.

The circuit protection device may include a fourth sheet provided on a top of the second sheet and formed with a third coil pattern and a fifth sheet provided on a bottom of the third sheet and formed with a fourth coil pattern. Herein, the first coil pattern may be connected to the fourth coil pattern through the holes filled with the conductive material and formed on the sheets therebetween, and the second coil pattern may be connected to the third coil pattern through the holes filled with the conductive material and formed on the sheets therebetween.

The circuit protection device may include first withdrawal electrodes connected to the coil patterns, respectively, and exposed outwards from the sheets, respectively, a second withdrawal electrode connected to the capacitor electrode and exposed outwards from the sheet, and third and fourth withdrawal electrodes connected to hole filled with the ESD protection material, respectively, and withdrawn toward the first and second withdrawal electrodes, respectively.

The circuit protection device may further include a first external electrode connected to the first and third withdrawal electrodes and formed on sides of the sheets and a second external electrode connected to the second and fourth withdrawal electrodes and formed on sides of the sheets. Herein, the first external electrode may be connected between an input/output terminal and the second external electrode may be connected to a ground terminal

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
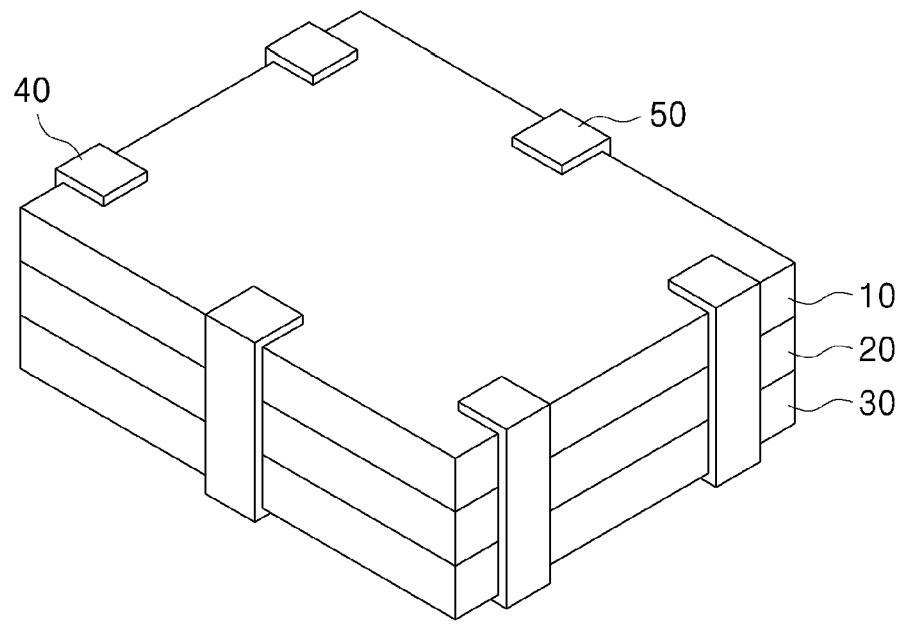
FIG. 1 is a coupled perspective view of a circuit protection device according to an embodiment of the present invention.

Hereinafter, exemplary embodiments will be described in detail with reference to the accompanying drawings. The present disclosure may, however, be embodied in many different forms and should not be construed as being limited to the embodiments set forth herein; rather, these embodiments are provided so that this disclosure will be thorough and complete, and will fully convey the concept of the invention to those skilled in the art. Further, the present disclosure is only defined by scopes of claims.

Hereinafter, embodiments of the present invention will be described in detail with reference to the attached drawings. However, the present invention is not limited to the embodiments disclosed below but may be embodied as various different shapes. Merely, the embodiments below are provided to fully disclose the present invention and to allow a person of ordinary skill in the art to consummately know the scope of the present invention. In the drawings, to definitely illustrate several layers and respective areas, thicknesses are exaggerated. Throughout the drawings, like reference numerals designate like elements.

Figure 2:
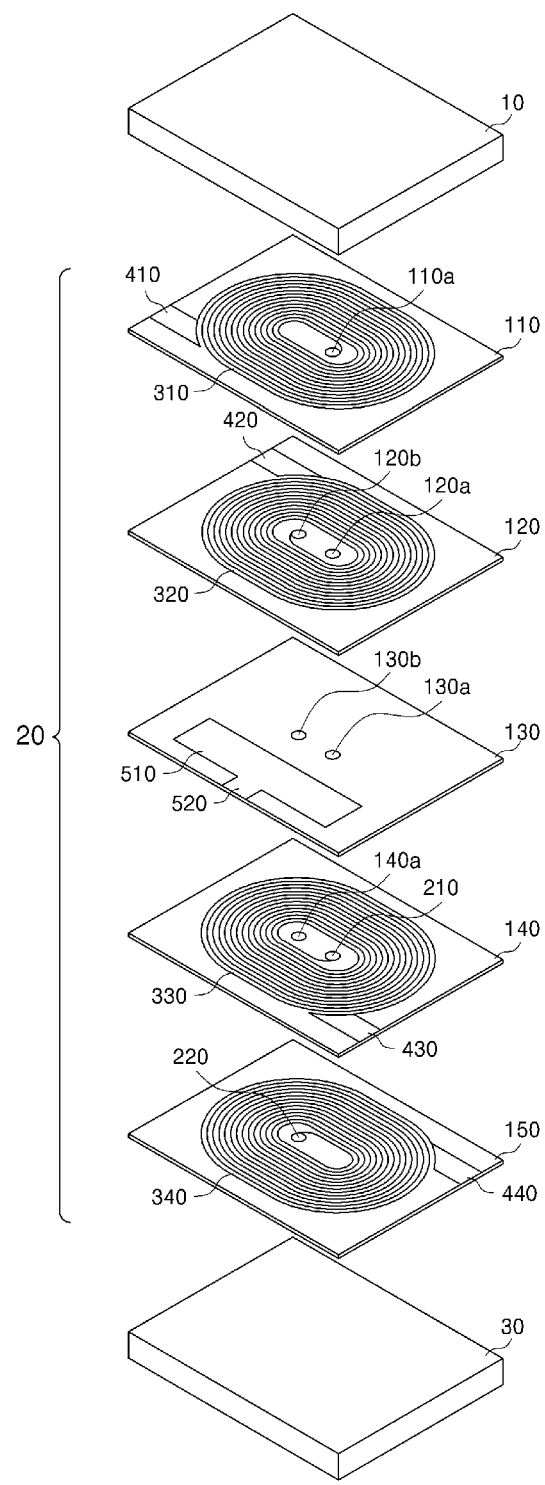
FIG. 2 is an exploded perspective view of the circuit protection device of FIG. 1.
Figure 3:
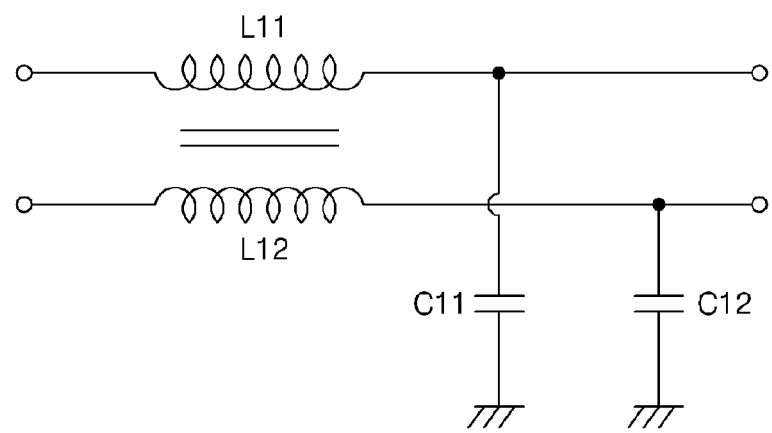
FIG. 3 is an equivalent circuit diagram of the circuit protection device of FIG. 1.
Figure 4:
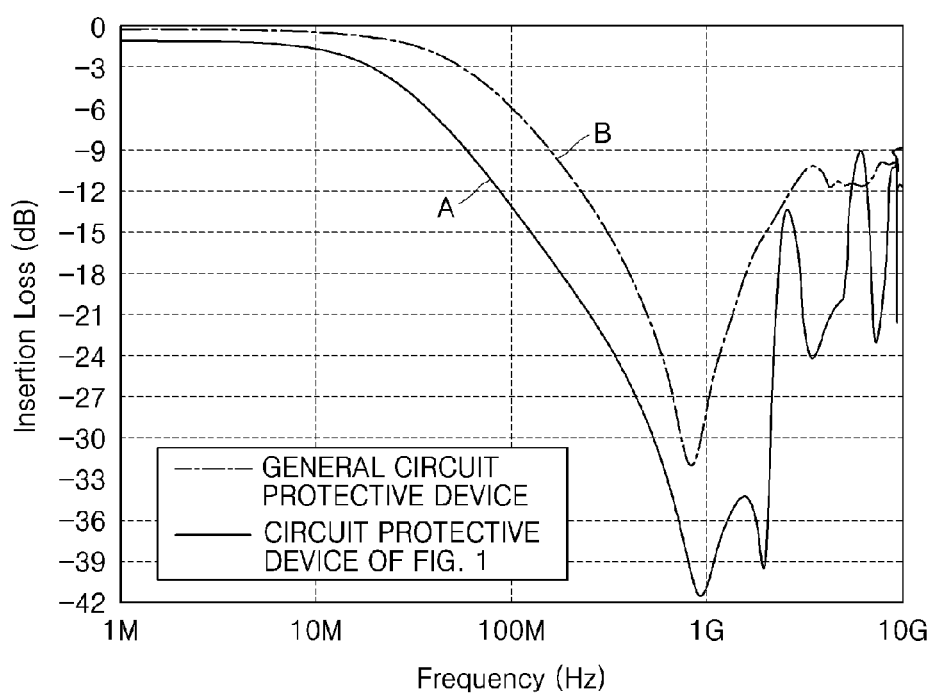
FIG. 4 is a graph illustrating properties of the circuit protection device of FIG. 1 and a general circuit protection device.

FIG. 1 is a coupled perspective view illustrating an external shape of a circuit protection device according to an embodiment of the present invention, FIG. 2 is an exploded view of the circuit protection device, and FIG. 3 is an equivalent circuit diagram of the circuit protection device. Also, FIG. 4 is a graph illustrating properties of the circuit protection device of FIG. 1 and a general circuit protection device.

Referring to FIG. 1, the circuit protection device is formed of a laminate body with a plurality of insulating sheets and, from a top, includes a top cover layer 10, a common noise filter 20, and a bottom cover layer 30. Also, the circuit protection device further includes a first external electrode 40 formed on a side of the laminate body and connected to a withdrawal electrode in the common mode noise filter 20 and a second external electrode 50 connected to a capacitor electrode in the common mode noise filter 20. The first external electrode 40 may be provided on a first side of the laminate body and a second side opposite thereto, respectively and may be provided two on the first and second sides, respectively. The second external electrode 50 may be provided on a third and fourth sides of the laminate body, not formed with the first external electrode 40, and may be provided one on the third and fourth sides, respectively. The first external electrode 40 is connected to between an input terminal and an output terminal, and the second external electrode 50 may be connected to a ground terminal That is, the first external electrode 40 formed on one side of the circuit protection device may be connected to a signal input terminal and the first external electrode 40 formed on another side corresponding thereto may be connected to an output terminal such as a system. On the other hand, the top cover layer 10 and the bottom cover layer 30 may be formed by laminating a plurality of sheets, respectively. The plurality of sheets and a plurality of sheets forming the common mode noise filter 20 are nonmagnetic sheets.

The common mode noise filter 20, as shown in FIG. 2, may be laminated with a plurality of sheets 110 to 150. The plurality of sheets 110 to 150 may be selectively formed with a withdrawal electrode, a coil pattern, a hole filled with a conductive material, and a capacitor electrode. That is, the common mode noise filter 20 may include the plurality of sheets 110 to 150, holes 110a, 120a, 120b, 130a, 130b, and 140a selectively formed in the plurality of sheets 110 to 150 and filled with a conductive material, connection electrodes 210 and 220 formed on selected sheets 140 and 150, coil patterns 310, 320, 330, and 340 formed on selected sheets 110, 120, 140, and 150, withdrawal electrodes 410, 420, 430, and 440 formed on selected sheets 110, 120, 140, and 150, connected to the coil patterns 310, 320, 330, and 340, and withdrawn outwards, a capacitor electrode 510 formed on the sheet 130, and a withdrawal electrode 520 connected to the capacitor electrode 510 and withdrawn outwards. A configuration of the common mode noise filter 20 will be described in detail as follows.

The sheet 110 is formed with the hole 110a, the coil pattern 310, and the withdrawal electrode 410. The sheet 110 may have an approximate quadrangular plate having a certain thickness. That is, the sheet 110 may have a square or rectangular shape. The hole 110a may be formed in a certain area, separate from a dead center of the sheet 110 in one direction. The dead center may be defined as a point where two diagonals meet each other when drawing virtual diagonal lines from four corners. For example, when the sheet 110 may have a rectangular shape and the hole 110a may be formed being separate from the dead center of the sheet 110 with a certain interval in a direction of one long side. The hole 110a is filled with a conductive material and may be filled using a paste of a metal material. Also, the coil pattern 310 may be formed by rotating from the hole 110a in one direction with a certain number of turns. Herein, the coil pattern 310 may be formed not to pass a central area of the sheet 110. For example, the coil pattern 310 has a certain width and interval and may have a spiral shape rotating outwards counterclockwise. Herein, a linear width and an interval of the coil pattern 310 may be same. Also, an end of the coil pattern 310 is connected to the withdrawal electrode 410. The withdrawal electrode 410 is formed to have a certain width and to be exposed from one side of the sheet 110. For example, the withdrawal electrode 410 extends in a direction of a long side of the sheet 110 and may be exposed from one short side of the sheet 110 in a direction from the dead center of the sheet, opposite to a direction, in which the hole 110a is formed.

The sheet 120 is formed with the two holes 120a and 120b, the coil pattern 320, and the withdrawal electrode 420. The sheet 120 is provided to have a quadrangular plate shape having a certain thickness and may have the same shape of the sheet 110. The hole 120a may be formed in a central area of the sheet 120 while penetrating the sheet 120. Herein, the hole 120a may be formed in the same location the hole 110a formed in the sheet 110. Also, the hole 120b may be formed in a certain area while being separate from a dead center with the same distance as a distance between the hole 120a and the dead center in another direction. That is, with the dead center of the sheet 120 as a reference, the two holes 120a and 120b are formed to be separate with the same interval in mutually opposite directions. The holes 120a and 120b are filled with a conductive material and may be filled using a paste of a metal material. Also, the hole 120a is connected to the conductive material in the hole 110a of the sheet 110 by the conductive material. The coil pattern 320 may be formed by rotating from the hole 120b in one direction with a certain number of turns. Herein, the coil pattern 320 may be formed not to pass the central area of the sheet 120 and the hole 120a. For example, the coil pattern 320 has a certain width and interval and may have a spiral shape rotating outwards counterclockwise. That is, the coil pattern 320 may be formed rotating in the same direction with the coil pattern 310 formed on the sheet 110. Also, an end of the coil pattern 320 is connected to the withdrawal electrode 420. The withdrawal electrode 420 is formed to have a certain width and to be exposed from one side of the sheet 120. Herein, the withdrawal electrode 420 is formed to be separate from the withdrawal electrode 410 formed on the sheet 110 with a certain interval and to be exposed in the same direction.

The sheet 130 is formed with the two holes 130a and 120b, the capacitor electrode 510, and the withdrawal electrode 520. The holes 130a and 130b may be formed to be separate from each other and may be separate along a long side from a dead center of the sheet 310 in one direction and another direction opposite to each other. Herein, the hole 130a may be formed in the same location with the hole 120a of the sheet 120 and the hole 130b may be formed in the same location with the hole 120b of the sheet 120. The holes 130a and 120b are filled with a conductive material and may be filled using a paste of a metal material. The holes 130a and 130b are connected to the conductive material in the holes 120a and 120b of the sheet 120, respectively. The capacitor electrode 510 is formed with a certain area in at least one area on the sheet 130 while being separate from the holes 130a and 130b. A ratio of an area of the capacitor electrode 510 to an area of the sheet 130 not formed with the capacitor electrode 510, for example, may be one of 1:100 and 100:1. That is, the capacitor electrode 510 may be formed in an area of 1% of the area of the sheet 130 or may be formed on the whole top of the sheet 130 not to be in contact with the holes 130a and 130b. Also, the capacitor electrode 510 may be formed to have various shapes such as a quadrangle, a polygon including a shape with rounded corners, a circle, an oval, a spiral, and a meander shape. Particularly, the capacitor electrode 510 may have the same shape as the coil patterns 310, 320, 330, and 340. The capacitor electrode 510 allows capacitors to be provided between the sheet 130 and the sheet 120 and between the sheet 130 and the sheet 140, respectively. That is, there may be provided two capacitors. Also, according to the area of the capacitor electrode 510, capacitance of the circuit protection device may be controlled. On the other hand, a part of the capacitor electrode 510 may be formed to be exposed from one side of the sheet 130. For example, a part of the capacitor electrode 510 may be exposed from one side to be formed as the withdrawal electrode 520. The withdrawal electrode 520 may be exposed from one area of one short side of the sheet 130.

The sheet 140 is formed with the hole 140a, the connection electrode 210, the coil pattern 330, and the withdrawal electrode 430. The sheet 140 is provided to have a quadrangular plate shape having a certain thickness and may have the same shape of the sheets 110, 120, and 130. The hole 140a may be formed in a central area of the sheet 140 while penetrating the sheet 140. Herein, the hole 140a may be formed in the same location as the hole 130b formed in the sheet 130 and the hole 120b formed in the sheet 120. The hole 140a is filled with a conductive material and, for example, may be filled using a paste of a metallic material, thereby being connected to the holes 120b and 130b of the sheets 120 and 130. Also, the connection electrode 210 may be formed in a certain area separate from a dead center with the same distance as a distance between the dead center and the hole 140a in another direction. That is, with the dead center of the sheet 140 as a reference, the hole 140a and the connection electrode 210 are formed to be separate with the same interval in mutually opposite directions. Also, the coil pattern 340 may be formed by rotating from the connection electrode 210 in one direction with a certain number of turns. Herein, the coil pattern 340 may be formed not to pass a central area of the sheet 140 and the hole 140a. For example, the coil pattern 340 has a certain width and interval and may have a spiral shape rotating outwards counterclockwise. That is, the coil pattern 340 may be formed by rotating in a direction opposite to the coil patterns 310 and 320 formed on the sheets 110 and 120. Also, an end of the coil pattern 340 is connected to the withdrawal electrode 430. The withdrawal electrode 430 is formed to have a certain width and to be exposed from one side of the sheet 140. Herein, the withdrawal electrode 430 is formed to be exposed from a side opposite to the withdrawal electrode 410 formed on the sheet 110. Also, the withdrawal electrode 430 is formed to be in a line with the withdrawal electrode 410 formed on the sheet 110.

The sheet 150 is formed with the connection electrode 220, the coil pattern 340, and the withdrawal electrode 440. The sheet 150 is provided to have a quadrangular plate shape having a certain thickness and may have the same shape of the sheets 110, 120, 130, and 140. The connection electrode 220 may be formed in a certain area separate from a dead center of the sheet 150 in one direction. For example, the connection electrode 220 may be formed in the same area of the hole 140a of the sheet 140. Also, the coil pattern 340 may be formed by rotating from the connection electrode 220 in one direction with a certain number of turns. Herein, the coil pattern 340 may be formed not to pass a central area of the sheet 150. For example, the coil pattern 340 has a certain width and interval and may have a spiral shape rotating outwards clockwise. Also, an end of the coil pattern 340 is connected to the withdrawal electrode 440. The withdrawal electrode 440 is formed to have a certain width and to be exposed from one side of the sheet 150. For example, the withdrawal electrode 440 extends in a direction of a long side of the sheet 150 while being separate from the withdrawal electrode 430 formed on the sheet 140 and being in a line with the withdrawal electrode 420 formed on the sheet 120.

As described above, the circuit protection device is provided with the sheets 110 and 120 formed with the coil patterns 310 and 320 on a top thereof, respectively, with the sheet 130 formed with the capacitor electrode 510 intervening therebetween and is provided with the sheets 140 and 150 formed with the coil patterns 330 and 340, respectively, on a bottom thereof. Also, the coil pattern 310 of the sheet 110 is connected to the coil pattern 330 of the sheet 140 through the hole 120a of the sheet 120 and the hole 130a of the sheet 130. The coil pattern 320 of the sheet 120 is connected to the coil pattern 340 of the sheet 150 through the hole 130b of the sheet 130 and the hole 140a of the sheet 140. That is, the coil pattern 310 on the top is connected to the coil pattern 330 on the bottom and the coil pattern 320 on the top is connected to the coil pattern 340 on the bottom. In other words, two coil patterns are formed on a top and a bottom, respectively, in which one coil pattern on the top is connected to one coil pattern on the bottom. Accordingly, in case of the circuit protection device, the coil pattern 330 connected to the coil pattern 310 forms a first inductor L11 and the coil pattern 340 connected to the coil pattern 320 forms a second inductor L12. Also, in the circuit protection device, the capacitor electrode 510 is provided between the sheets 120 and 140, thereby forming a first capacitor C11 between the capacitor electrode 510 and the coil pattern 330 and forming a second capacitor C12 between the capacitor electrode 510 and the coil pattern 320. The circuit protection device, as shown in the equivalent circuit diagram of FIG. 3, includes the first and second inductors L11 and L12 and the first and second capacitors C11 and C12 connected thereto, respectively. That is, the circuit protection device includes at least two inductors L11 and L12 and at least two capacitors C11 and C12 connected thereto, respectively.

The circuit protection device may control inductance and capacitance by controlling the numbers of turns of the coil patterns 310, 320, 330, and 340, the area of the capacitor electrode 510, and intervals between the coil patterns 310, 320, 330, and 340, that is, thicknesses of the sheets 110, 120, 130, and 140, thereby controlling a noise of restrainable frequency. For example, a noise in a low frequency bandwidth may be restrained by decreasing the thicknesses of the sheets 110, 120, 130, and 140 and a noise in a high frequency bandwidth may be restrained by increasing the thicknesses. As described above, the circuit protection device formed of two inductors and two capacitors, that is, a common mode noise filter may restrain noises in two frequency bandwidths. That is, as shown in FIG. 4, frequency properties A of the circuit protection device show two peaks in bandwidths of 1 GHz and higher, thereby restraining noises in two frequency bandwidths. However, a general common mode noise filter B not including a capacitor shows one peak in one bandwidth of 1 GHz, thereby only restraining a noise in one frequency bandwidth. Accordingly, the circuit protection device may restrain noises in two or more frequency bandwidths, thereby being used in mobile electronic apparatuses such as smart phones employing functions of various frequencies to improve qualities of electronic apparatuses.

On the other hand, the circuit protection device has been described referring a common mode noise filter formed of two inductors and two capacitors as an example. However, the circuit protection device may have a structure, in which a common mode noise filter is coupled with electrostatic discharge (ESD) protection device. That is, a common mode noise filter formed of at least two inductors and at least two capacitors is coupled with an ESD protection device, thereby providing a circuit protection device. The circuit protection device as described above will be described with reference to FIGS. 5 and 6.

Figure 5:
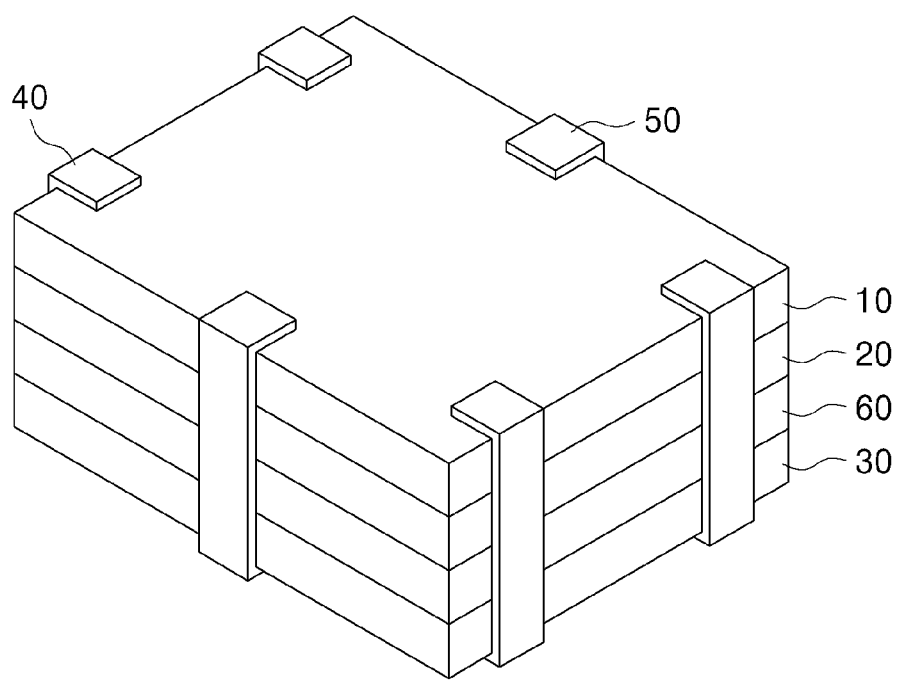
FIG. 5 is a coupled perspective view of a circuit protection device according to another embodiment of the present invention.
Figure 6:
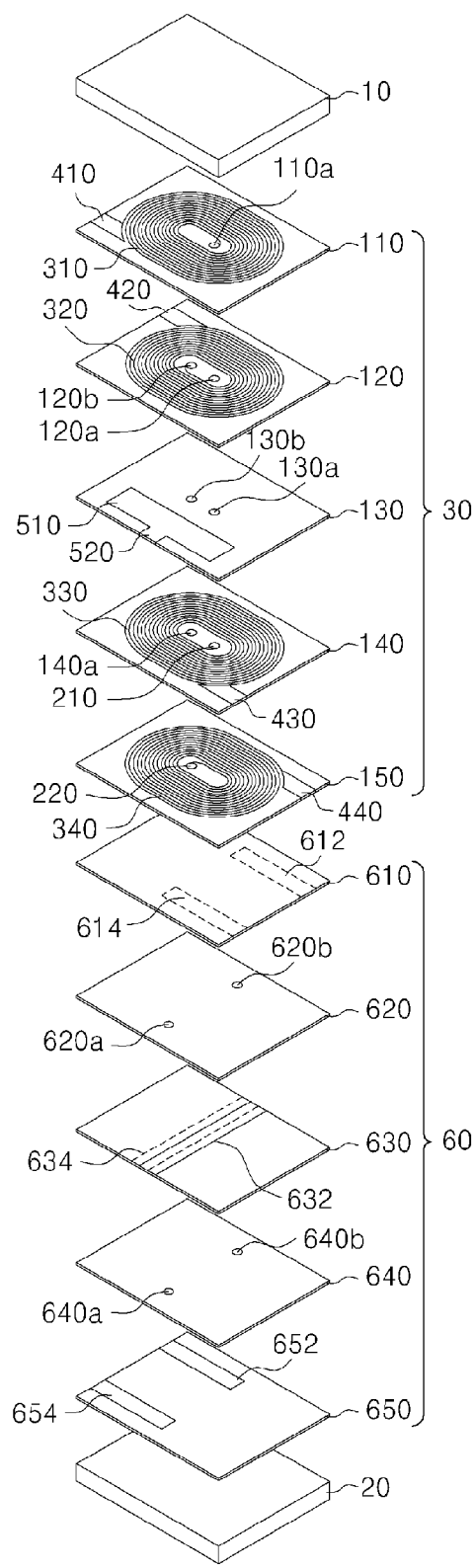
FIG. 6 is an exploded perspective view of the circuit protection device of FIG. 5.

FIG. 5 is a coupled perspective view of a circuit protection device according to another embodiment of the present invention, and FIG. 6 is an exploded perspective view of the circuit protection device of FIG. 5.

Referring to FIG. 5, the circuit protection device is formed laminating a plurality of insulating sheets and, from a top, includes the top cover layer 10, the common noise filter 20, an ESD protection device 60, and the bottom cover layer 30. That is, the common mode noise filter 20 and the ESD protection device 60 are laminated between the top cover layer 10 and the bottom cover layer 30. Also, the circuit protection device further includes the first external electrode 40 connected to withdrawal electrodes of the common mode noise filter 20 and some of withdrawal electrodes in the ESD protection device 60 and the second external electrode 50 connected to a capacitor electrode in the common noise filter 20 and some of the withdrawal electrodes in the ESD protection device 60.

The common mode noise filter 20, as shown in FIG. 6, may be configured by laminating a plurality of sheets 110 to 150 selectively formed with a withdrawal electrode, a coil pattern, a hole filled with a conductive material, and a capacitor electrode. That is, the common mode noise filter 20 may include the plurality of sheets 110 to 150, holes 110a, 120a, 120b, 130a, 130b, and 140a selectively formed in the plurality of sheets 110 to 150 and filled with a conductive material, connection electrodes 210 and 220 formed on selected sheets 140 and 150, coil patterns 310, 320, 330, and 340 formed on selected sheets 110, 120, 140, and 150, withdrawal electrodes 410, 420, 430, and 440 formed on selected sheets 110, 120, 140, and 150, connected to the coil patterns 310, 320, 330, and 340, and withdrawn outwards, a capacitor electrode 510 formed on the sheet 130, and a withdrawal electrode 520 connected to the capacitor electrode 410 and withdrawn outwards. That is, a configuration of the common mode noise filter 20 may be identical to that of the common mode noise filter described with reference to FIG. 2. Accordingly, a description of the configuration of the common mode noise filter 20 will be omitted.

The ESD protection device 60 is configured by laminating a plurality of sheets 610, 620, 630, 640, 650, and 660 selectively formed with a withdrawal electrode and a hole, respectively.

A plurality of withdrawal electrodes 612 and 614 are formed on a bottom of the sheet 610. The plurality of withdrawal electrodes 612 and 614 are formed as straight lines to be exposed from one short side from a central area of a bottom of the sheet 610 while being separate from each other. The withdrawal electrodes 612 and 614 are connected to the first external electrode 40.

A plurality of holes 620a and 620b are formed on the sheet 620. The plurality of holes 620a and 620b are formed in locations corresponding to the plurality of withdrawal electrodes 612 and 614 formed from the central area of the sheet 610. That is, the plurality of holes 620a and 620b are formed in a central area of the sheet 620 while being separate from each other. Also, the plurality of holes 620a and 620b each is filled with an ESD protection material. The ESD protection material may be formed by mixing one of organic materials such as polyvinyl alcohol (PVA) and polyvinyl butyral (PVB) with at least one conductive material selected from $RuO_2$, Pt, Pd, Ag, Au, Ni, Cr, and W. Also, the ESD protection material may be formed by further mixing a mixture described above with one of a varistor material and an insulating ceramic material such as $Al_2O_3$.

Withdrawal electrodes 632 and 634 are formed on a top and a bottom of the sheet 630, respectively. The withdrawal electrodes 632 and 634 are formed in locations corresponding to each other on the top and the bottom of the sheet 630 while being formed as straight lines to pass through locations corresponding to the locations of the holes 620a and 620b of the sheet 620 and to be exposed from central areas of one short side and another short side of the sheet 630. The withdrawal electrodes 632 and 634 are connected to the first external electrode 50.

A plurality of holes 640a and 640b are formed on the sheet 640 while being formed in locations corresponding to the plurality of holes 620a and 620b formed on the sheet 620, respectively. Also, the plurality of holes 640a and 640b each is filled with an ESD protection material.

A plurality of withdrawal electrodes 652 and 654 are formed on the sheet 650. The plurality of withdrawal electrodes 652 and 654 are formed extending to one long side of the sheet 610 exposed with the withdrawal electrodes 612 and 614 and to another long side of the sheet 650 opposite thereto. Herein, the withdrawal electrode 652 is being formed as straight lines to be exposed from a certain area of the sheet 650 corresponding to the holes 620a and 640a to a long side of the sheet 650. Also, the withdrawal electrode 654 are formed as straight lines to be exposed from a certain area of the sheet 650 corresponding to the holes 620b and 640b to another long side of the sheet 650 and are separate from the withdrawal electrode 652. The withdrawal electrodes 652 and 654 are connected to the first external electrode 40.

In the ESD protection device 60, the ESD protection material in the holes 620a, 620b, 640a, and 640b are present while a conductive material is being mixed with an insulating material at a certain ratio. That is, conductive particles are present in insulating materials. When a voltage of a certain level or less is applied to withdrawal electrodes, an insulation state is maintained. When a voltage higher than the certain level is applied to withdrawal electrodes, an electric discharge occurs between conductive particles, thereby reducing a difference between corresponding withdrawal electrodes.

As described above, in the circuit protection device configured by combining the common mode noise filter formed of two inductors and two capacitors with the ESD protection device, the first external electrode 40 is connected between a signal input terminal and a system used in an electronic apparatus and the second external electrode 50 is connected to a ground terminal, thereby not only removing a common mode noise but also allowing static electricity flowing into an input/output terminal to flow into the ground terminal. That is, the common mode noise filter is disposed between a power source and the system, thereby effectively restraining the common mode noise. Also, the ESD protection device is connected to the ground terminal between the input/output terminal and the system. When an undesirable voltage higher than a certain level is applied to both ends of the circuit protection device, an electric discharge occurs between conductive particles of the ESD protection material, thereby allowing a current to flow into the ground terminal and reducing a difference in voltage between both ends of the corresponding circuit protection device. Herein, since the both ends of the circuit protection device are not in a conduction state, an input signal is transmitted to the input/output terminal without distortion. That is, in case of the circuit protection device, when static electricity occurs, the corresponding static electricity flows into the ground through the corresponding circuit protection device, thereby protecting a circuit simultaneously with keeping a signal transmitted and received by the system as it is.

On the other hand, in the circuit protection devices according to the embodiments, the common mode noise filter 20 connected with coil patterns formed on a top and a bottom thereof, thereby forming an inductor. However, a common mode noise filter may be configured to allow coil patterns to surround a magnetic core. That is, a hole is formed in dead centers of the sheets 110 to 150 and is filled with a magnetic material, thereby vertically forming a magnetic core and providing an inductor to vertically surrounding the magnetic core.

The circuit protection device may be formed of a common mode noise filter including at least two inductors and at least two capacitors formed by laminating a plurality of sheets selectively formed with a coil pattern, a withdrawal electrode, a hole filled with a conductive material, and a capacitor electrode. Accordingly, the circuit protection device may be used for a mobile electronic device such as a smart phone and may restrain noises in two or more frequency bandwidths, thereby improving quality of the electronic device.

Also, the circuit protection device may be formed by laminating an electrostatic discharge (ESD) protection device laminated with a plurality of sheets selectively formed with a withdrawal electrode and a hole filled with an ESD protection material together with the common mode noise filter. The common mode noise filter and the ESD protection device are laminated, thereby allowing the circuit protection device to be manufactured as a single chip and to be miniaturized. Accordingly, an increase in size of the electronic device may be prevented, a mounting area may be significantly reduced, and distortions of input/output signals may be prevented by providing a low capacitance ESD protection device, thereby improving reliability of the electronic device.

Although the circuit protection device has been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A circuit protection device comprising:
   a first sheet formed with a capacitor electrode;
   second and third sheets respectively provided on a top and a bottom of the first sheet and formed with first and second coil patterns, respectively; and
   fourth and fifth sheets respectively provided on a top and a bottom of the second and third sheets and formed with third and fourth coil patterns, respectively,
   wherein the first coil pattern is connected to the fourth coil pattern through holes filled with a conductive material formed in the sheets therebetween to form a first inductor, and the second coil pattern is connected to the third coil pattern through holes filled with a conductive material formed in the sheets therebetween to form a second inductor, and
   capacitors are formed between the capacitor electrode and the first and second coil patterns, respectively.

2. The circuit protection device of claim 1, wherein a ratio of an area of the capacitor electrode to an area of the first sheet not formed with the capacitor electrode is from about 1:100 to about 100:1.

3. The circuit protection device of claim 2, wherein the capacitor electrode has a shape of one of a quadrangle, a polygon including a shape with rounded corners, a circle, an oval, a spiral, and a meander shape.

4. The circuit protection device of claim 1, wherein inductance and capacitance are controlled according to at least one of a number of turns of the first to fourth coil patterns, an area of the capacitor electrode, and a distance between the capacitor electrode and the first to fourth coil patterns.

5. The circuit protection device of claim 1, wherein at least one of the first through fifth sheets are formed with a hole filled with a magnetic material separate from the holes filled with the conductive material.

6. The circuit protection device of claim 1, further comprising:
   first withdrawal electrodes connected to the first to fourth coil patterns, respectively, and exposed outwards from the first through fifth sheets, respectively; and
   second withdrawal electrodes connected to the capacitor electrode and exposed outwards from the first sheet.

7. The circuit protection device of claim 6, wherein the first withdrawal electrodes are exposed from two sides of the first through fifth sheets opposite to one another and the second withdrawal electrode is exposed from at least one side intersecting with the sides exposed with the first withdrawal electrodes.

8. The circuit protection device of claim 7, further comprising a first external electrode formed on sides of the first through fifth sheets while being connected to the first withdrawal electrodes and a second external electrode formed on sides of the first through fifth sheets while being connected to the second withdrawal electrode,
   wherein the first external electrode is connected between an input/output terminal and a circuit and the second external electrode is connected to a ground terminal.

9. A circuit protection device comprising:
   a first sheet formed with a capacitor electrode;
   a second sheet formed on a top of the first sheet and formed with a first coil pattern;
   a third sheet provided on a bottom of the first sheet and formed with a second coil pattern;
   a fourth sheet provided on a top of the second sheet and formed with a third coil pattern; and
   a fifth sheet provided on a bottom of the third sheet and formed with a fourth coil pattern,
   wherein the first coil pattern is connected to the fourth coil patterns to form a first inductor, and the second coil pattern is connected to the third coil patterns to form a second inductor, and
   capacitors are formed between the capacitor electrode and the first and second coil patterns, respectively.

10. The circuit protection device of claim 9, wherein:
    the first coil pattern is connected to the fourth coil pattern through holes filled with conductive material and formed on the sheets therebetween, and
    the second coil pattern is connected to the third coil pattern through the holes filled with the conductive material and formed on the sheets therebetween.

11. The circuit protection device claim 10, wherein inductance and capacitance are controlled according to at least one of a number of turns of the first through fourth coil patterns, an area of the capacitor electrode, and a distance between the capacitor electrode and the coil pattern.

12. A circuit protection device comprising:
    a common mode noise filter laminated with a plurality of sheets selectively formed with at least one coil pattern and at least one capacitor electrode; and
    an electrostatic discharge (ESD) protection device comprising a plurality of sheets selectively formed with at least one withdrawal electrode and at least one hole filled with an ESD protection material,
    wherein the common mode noise filter comprises:
      a first sheet formed with a capacitor electrode;
      second and third sheets respectively provided on a top and a bottom of the first sheet and formed with first and second coil patterns, respectively; and
      fourth and fifth sheets respectively provided on a top and a bottom of the second and third sheets and formed with third and fourth coil patterns, respectively,
      wherein the first coil pattern is connected to the fourth coil pattern through holes filled with a conductive material formed in the sheets therebetween to form a first inductor, and the second coil pattern is connected to the third coil pattern through holes filled with a conductive material formed in the sheets therebetween to form a second inductor, and
      capacitors are formed between the capacitor electrode and the first and second coil patterns, respectively.

13. The circuit protection device of claim 12, wherein the common mode noise filter and the ESD protection device are laminated top and bottom and coupled with each other.

14. The circuit protection device of claim 12, wherein
the first coil pattern is connected to the fourth coil pattern through the holes filled with the conductive material and formed on the sheets therebetween, and
the second coil pattern is connected to the third coil pattern through the holes filled with the conductive material and formed on the sheets therebetween.

15. The circuit protection device of claim 14, comprising:
first withdrawal electrodes connected to the coil patterns, respectively, and exposed outwards from the sheets, respectively;
a second withdrawal electrode connected to the capacitor electrode and exposed outwards from the sheet; and
third and fourth withdrawal electrodes connected to hole filled with the ESD protection material, respectively, and withdrawn toward the first and second withdrawal electrodes, respectively.

16. The circuit protection device of claim 15, further comprising a first external electrode connected to the first and third withdrawal electrodes and formed on sides of the sheets and a second external electrode connected to the second and fourth withdrawal electrodes and formed on sides of the sheets,
wherein the first external electrode is connected between an input/output terminal and the second external electrode is connected to a ground terminal.

* * * * *